(12) United States Patent
Yow et al.

(10) Patent No.: US 8,501,517 B1
(45) Date of Patent: Aug. 6, 2013

(54) METHOD OF ASSEMBLING PRESSURE SENSOR DEVICE

(75) Inventors: Kai Yun Yow, Petaling Jaya (MY); Poh Leng Eu, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 17 days.

(21) Appl. No.: 13/441,928

(22) Filed: Apr. 9, 2012

(51) Int. Cl.
*H01L 21/56* (2006.01)

(52) U.S. Cl.
USPC ............ 438/51; 438/112; 438/126; 438/127; 257/E21.504

(58) Field of Classification Search
USPC ............ 438/51, 112, 126, 127; 257/E21.504
See application file for complete search history.

(56) References Cited

U.S. PATENT DOCUMENTS

| | | | |
|---|---|---|---|
| 5,216,283 A | 6/1993 | Lin | |
| 5,328,079 A | 7/1994 | Mathew | |
| 5,468,999 A | 11/1995 | Lin | |
| 5,639,990 A | 6/1997 | Nishihara et al. | |
| 5,723,906 A | 3/1998 | Rush | |
| 6,545,332 B2 | 4/2003 | Huang | |
| 6,617,700 B2 | 9/2003 | Lee | |
| 6,677,672 B2 | 1/2004 | Knapp et al. | |
| 6,759,753 B2 | 7/2004 | Chao | |
| 6,927,480 B2 | 8/2005 | Lee et al. | |
| 7,014,888 B2 | 3/2006 | Mcdonald | |
| 7,157,312 B2 * | 1/2007 | Kim et al. | ............ 438/123 |
| 7,208,826 B2 | 4/2007 | Sakamoto et al. | |
| 7,358,599 B2 | 4/2008 | Ohe et al. | |
| 7,476,972 B2 | 1/2009 | Takahashi | |
| 7,759,806 B2 | 7/2010 | Tay et al. | |
| 7,800,225 B2 | 9/2010 | Choi | |
| 8,163,604 B2 | 4/2012 | Ong et al. | |
| 2004/0021209 A1 * | 2/2004 | Shiono et al. | ............ 257/682 |
| 2004/0197957 A1 * | 10/2004 | Schuurmans et al. | ......... 438/112 |
| 2005/0236644 A1 * | 10/2005 | Getten et al. | ............ 257/106 |
| 2006/0053895 A1 | 3/2006 | Kandler | |
| 2011/0036174 A1 * | 2/2011 | Hooper et al. | ............ 73/721 |
| 2013/0126988 A1 * | 5/2013 | Lo | ............ 257/415 |

OTHER PUBLICATIONS

U.S. Appl. No. 12/938,376, Inventor Beng Song Lee, "Semiconductor Device and Method of Assembling Same", filed Nov. 3, 2010, Office Action—Rejection, mailed May 3, 2012.

\* cited by examiner

*Primary Examiner* — George Fourson, III
(74) *Attorney, Agent, or Firm* — Charles Bergere

(57) ABSTRACT

A method of assembling a pressure sensor device includes providing a substrate having a plurality of substrate connection pads. A pressure sensor die is attached to a first major surface of the substrate and bond pads of the pressure sensor die are electrically connected to the respective substrate connection pads. A retractable cavity pin is placed on the first major surface of the substrate such that the cavity pin covers the pressure sensor die and the electrical connections to the die. A molding compound is then dispensed onto the first major surface of the substrate such that the molding compound surrounds the pressure sensor die and the cavity pin. The cavity pin is retracted such that a cavity is formed around the pressure sensor die and a gel material is dispensed within the cavity such that the gel material fills the cavity and covers the pressure sensor die.

17 Claims, 4 Drawing Sheets ion of the figures. For example, two figures shown in succession may in
METHOD OF ASSEMBLING PRESSURE SENSOR DEVICE

CROSS-REFERENCE TO RELATED APPLICATIONS

This application is related to commonly owned, co-pending U.S. patent application Ser. No. 12/938,376 filed on Nov. 3, 2010.

BACKGROUND OF THE INVENTION

The present invention relates generally to assembling semiconductor devices, and more particularly to a method of assembling a pressure sensor device.

Semiconductor sensor devices such as pressure sensor devices are well known. Pressure sensor dies are susceptible to mechanical damage during handling and packaging. For this reason, these sensor dies are typically mounted in pre-molded packages and then sealed in the packages using a separate cover/lid.

One way of packaging the semiconductor sensor dies is to mount the dies to a pre-molded lead frame and encapsulate the die and pre-molded lead frame with a mold compound. For example, current cavity QFN (Quad Flat No lead) packages require the lead frame to be pre-molded to create a cavity for a gel coating that covers the sensor. However, the premold process is not robust, often low yielding and may result in mold related defects. Moreover, premolded lead frames are relatively expensive, which makes the overall packaging costs unattractive.

Packages with pre-molded lead frames have other associated issues such as gel bleed between the mold and leads, mold flashing and voids, cavity height inconsistency and G-Cell and P-Cell parametric shifts during rapid decompression events (RDE).

Accordingly, it would be advantageous to be able to efficiently package the pressure sensor dies with the risk of environmental damage to the die being substantially reduced or eliminated while reducing the overall packaging costs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale. For example, the thicknesses of layers and regions may be exaggerated for clarity.

FIG. 2 is a side cross-sectional of a substrate having a plurality of substrate connection pads;

FIG. 3 is an illustration of a step of attaching a pressure sensor die to the substrate of FIG. 2;

FIG. 4 is an illustration of a step of placing a retractable cavity pin on the substrate of FIG. 2;

FIG. 5 shows a step of dispensing a molding compound onto a first major surface of the substrate;

FIG. 6 is an illustration of a step of retracting the cavity pin from the substrate;

FIG. 7 is an illustration of a step of dispensing a gel material within a cavity formed on the substrate;

FIG. 8 is a side cross-sectional view showing a substrate a having substrate connection pads;

FIG. 9 is an illustration of a step of attaching one or more semiconductor dies to the substrate of FIG. 8;

FIG. 10 shows a step of placing a retractable cavity pin on a first major surface of the substrate of FIG. 9;

FIG. 11 is an illustration of a step of dispensing a molding compound on the substrate of FIG. 10;

FIG. 12 is an illustration of a step of retracting the cavity pin from the substrate of FIG. 10 to form a cavity;

FIG. 13 is an illustration of a step of attaching a pressure sensor die to the substrate of FIG. 12; and FIG. 14 shows a step of dispensing a gel material within the cavity.

DETAILED DESCRIPTION OF THE INVENTION

Figure 1:
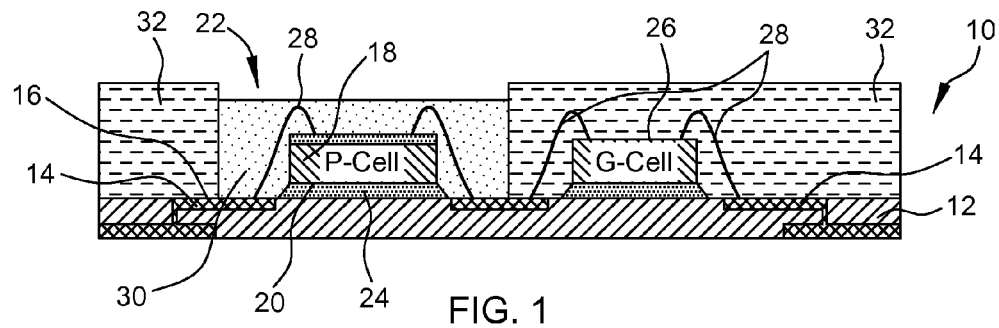
FIG. 1 is a cross-sectional view of an assembled pressure sensor device in accordance with one embodiment of the present invention.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a method of assembling a pressure sensor device. A substrate having a plurality of substrate connection pads is provided. A pressure sensor die is attached to a first major surface of the substrate and bond pads of the pressure sensor die are electrically connected to the respective substrate connection pads. A retractable cavity pin is placed on the first major surface of the substrate such that the cavity pin covers the pressure sensor die and the electrical connections thereto. A molding compound is then dispensed onto the first major surface of the substrate such that the molding compound surrounds the pressure sensor die and the cavity pin. The cavity pin is retracted such that a cavity is formed around the pressure sensor die and a gel material is dispensed within the cavity such that the gel material substantially fills the cavity and covers the pressure sensor die.

In yet another embodiment, the present invention provides another method of assembling a pressure sensor device. A substrate having a plurality of substrate connection pads is provided. One or more semiconductor dies are attached to a first major surface of the substrate and bond pads of the one or more semiconductor dies are electrically connected to respective substrate connection pads of the substrate. A retractable cavity pin is placed on the first major surface of the substrate and a molding compound is dispensed onto the first major surface of the substrate such that the molding compound surrounds the one or more semiconductor dies and the cavity pin. The cavity pin is then retracted whereby a cavity is formed and a pressure sensor die is attached to a die-attach area within the cavity. The bond pads of the pressure sensor die are electrically connected to respective substrate connection pads and a gel material is dispensed within the cavity such that the gel material substantially fills the cavity and covers the pressure sensor die.

In yet another embodiment, the present invention is a pressure sensor device assembled in accordance with the above-described methods.

Referring now to FIG. 1, a cross-sectional view of an assembled pressure sensor device 10 in accordance with an embodiment of the present invention is shown. The assembled pressure sensor device 10 includes a substrate 12 having a plurality of substrate connection pads generally represented by reference numeral 14 on a first major surface 16 of the substrate 12. In one example embodiment, the substrate 12 includes a flexible printed circuit board.

The device 10 also includes a pressure sensor die 18 attached to a die-attach area 20 of the substrate 12. The die-attach area 20 is located within a cavity 22. The cavity 22 is formed using a retractable cavity pin, which will be described below.

In this exemplary embodiment of the invention, the pressure sensor die 18 includes a piezo resistive transducer (PRT) die. However, it will be understood by those of skill in the art that the present invention is not limited to pressure sensor dies, but also applies to light sensitive sensors, light transmitting dies (LEDs), gas sensors, liquid sensors, etc. The pressure sensor die 18 may be attached to the substrate 12 by a die attach adhesive 24 such as epoxy.

In certain exemplary embodiments, one or more additional semiconductor dies such as represented by reference numeral 26 may be attached and electrically coupled to the substrate 12. The additional semiconductor dies in combination with the pressure sensor die 18 may form a sensing assembly that is suitable for particular applications. For example, microcontroller (MCU) die and (G-cell) die may be attached to the substrate 12. The one or more additional semiconductor dies 26 may be attached to the substrate 12 by a die attach adhesive 24 such as epoxy. The die attach adhesive may be subsequently cured using an oven.

In this exemplary embodiment of the invention, the pressure sensor die 18 and the additional semiconductor die 26 are attached and electrically coupled to the respective substrate connection pads 14 of the substrate 12 via wires 28. The wires 28 are bonded to respective bond pads of the dies 18 and 26 and to corresponding substrate connection pads 14 of the substrate 12, using a well known wire bonding process and known wire bonding equipment. The wires 28 are formed from a conductive material such as aluminum, copper or gold.

Another way of electrically connecting the semiconductor dies 18 and 26 to the substrate 12 is to connect bond pads of the semiconductor dies 18 and 26 to the respective substrate connection pads 14 of the substrate 12 with flip-chip bumps (not shown) attached to an underside of the respective dies. The flip-chip bumps may include solder bumps, gold balls, molded studs, or combinations thereof.

A gel material 30 such as a silicon-based gel is deposited within the cavity 22 such that the gel material 30 substantially fills the cavity 32 and covers the pressure sensor die 18. The device 10 also includes a molding compound 32 disposed around the cavity 22 that covers portions of the substrate 12 and the one or more additional semiconductor dies 26. The molding compound 32 may include plastic or an epoxy molding compound, as is known in the art.

Existing pressure sensor devices are formed by attaching a lid to a pre-molded cavity by using pre-molded lead frames. The present invention provides a method of assembling a pressure sensor device by forming a cavity after the pressure sensor die is attached and electrically connected to the substrate. The cavity is formed using a retractable cavity pin that is placed on the substrate before the molding compound is dispensed on the substrate.

Figure 2:
FIGS. 2-14 are side cross-sectional views illustrating various steps for assembling the pressure sensor device shown in FIG. 1, where

Referring now to FIGS. 2-7, a method of assembling a pressure sensor device in accordance with an embodiment of the invention will be described. FIG. 2 is a side cross-sectional view showing a substrate 12 having a plurality of substrate connection pads 14. In this example embodiment, the substrate 12 includes a flexible printed circuit board. In one example embodiment, the substrate 12 includes a Bismaleimide Triazine (BT) substrate. Alternatively the substrate 12 may include a metal substrate such as Alloy 42 or plated copper, plated aluminium, plated plastics or the like.

Figure 3:
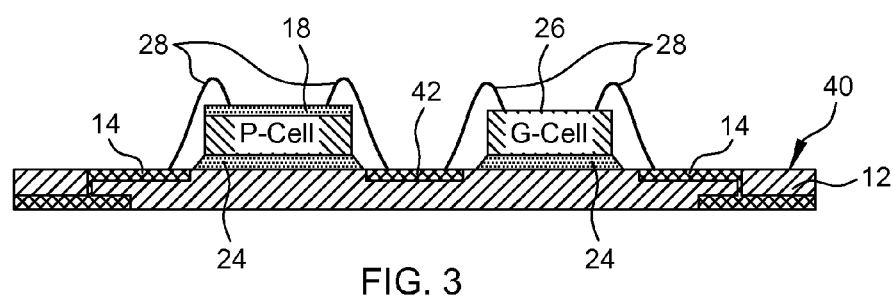

FIG. 3 is an illustration of a step of attaching a pressure sensor die 18 to the substrate 12. The pressure sensor die 18 is attached to a first major surface 40 of the substrate 12 by a die attach adhesive 24 such as epoxy or elastomer. However, other suitable adhesive materials may be utilized. The die attach adhesive 24 is subsequently cured as is known in the art. In this exemplary embodiment of the invention, the pressure sensor die 32 includes a piezo resistive transducer (PRT) die.

In the illustrated embodiment, one or more additional semiconductor dies such as represented by reference numeral 26 are attached to the first major surface 40 of the substrate 12. The additional semiconductor die 26 may include microcontroller (MCU) and (G-cell) dies. The additional semiconductor die 26 may be attached to the substrate 12 by the die attach adhesive 24 such as epoxy as is known in the art.

In this exemplary embodiment, bond pads of the pressure sensor die 18 and the one or more additional semiconductor dies 26 are electrically connected to the respective substrate connection pads 14 of the substrate with wires 28 using a well known wire bonding process and known wire bonding equipment. Moreover, the one or more additional semiconductor dies 26 are electrically connected to the pressure sensor die 18 via interconnects 42.

Figure 4:
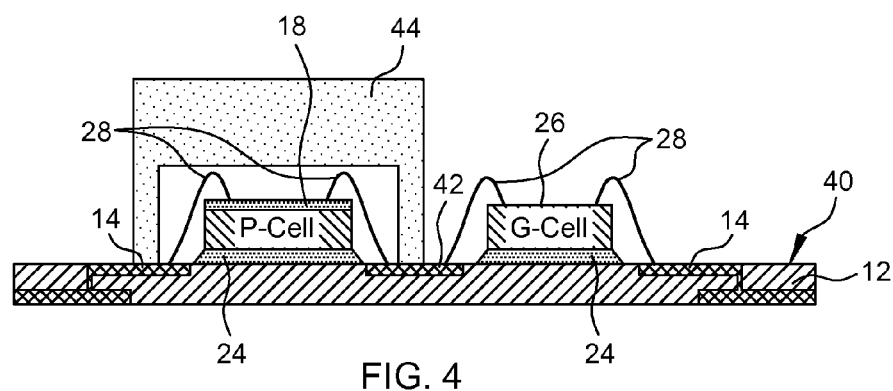

Another way of connecting the semiconductor die 26 is through flip-chip bumps (not shown) attached to an underside of the semiconductor die 26. The flip-chip bumps may include solder bumps, gold balls, molded studs, or combinations thereof. The bumps may be formed or placed on the semiconductor die 26 using known techniques such as evaporation, electroplating, printing, jetting, stud bumping and direct placement FIG. 4 is an illustration of a step of placing a retractable cavity pin 44 on the substrate 12. In the illustrated embodiment, the cavity pin 44 is placed on the first major surface 40 of the substrate 12 such that the cavity pin 44 covers the pressure sensor die 18 and the electrical connections thereto. The cavity pin 44 may be formed of materials such as Carbide, Tool steel P20, Stainless Steel, Carbon steel (plain-carbon steel). However, other suitable materials may be used for the cavity pin 44. In this embodiment, the cross section of the cavity pin 44 has a generally inverted-U shape. Other shapes may be envisaged for the cavity pin 44. The size of the cavity pin 44 is selected based upon a desired size of cavity required to hold the pressure sensor die 18.

Figure 5:
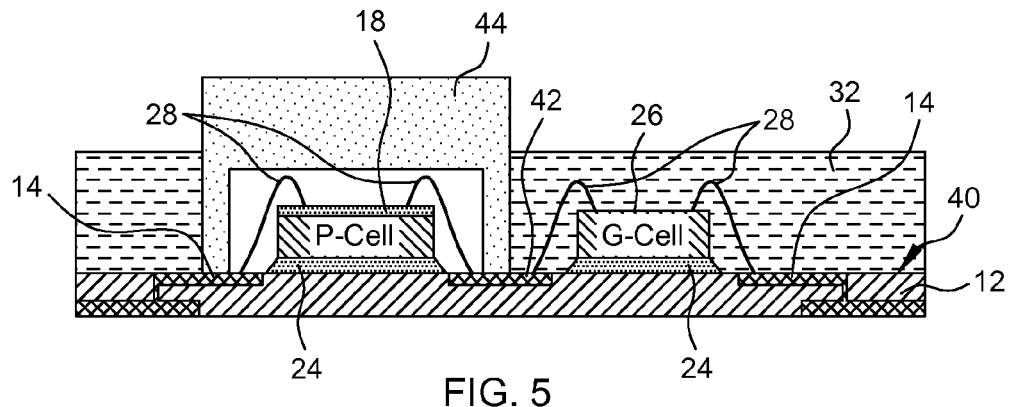

FIG. 5 shows a step of dispensing a molding compound 32 such as epoxy onto the first major surface 40 of the substrate 12. The molding compound 32 surrounds the pressure sensor die 18 and the cavity pin 44. The molding compound 32 encapsulates the one or more additional semiconductors 26 and the electrical connections thereto. One way of dispensing the molding compound 32 over the substrate 12 is using a nozzle of a conventional dispensing machine, as is known in the art. In the illustrated embodiment, the cavity pin 44 substantially prevents seeping through of the molding compound 32 during the molding process. That is, the cavity pin 44 surrounds all four (4) sides of the pressure sensor die 18 in order to prevent mold compound from seeping onto the die 18.

Alternatively, the molding compound 32 may include a silica-filled resin, a ceramic, a halide-free material, the like, or combinations of the above. The molding compound 32 is typically applied using a liquid, which is then heated to form a solid by curing in a UV or ambient atmosphere. The molding compound 32 can also be a solid that is heated to form a liquid and then cooled to form a solid mold. In alternative embodiments, other encapsulating processes may be used. Subsequently, an oven is used to cure the molding compound 32.

Figure 6:
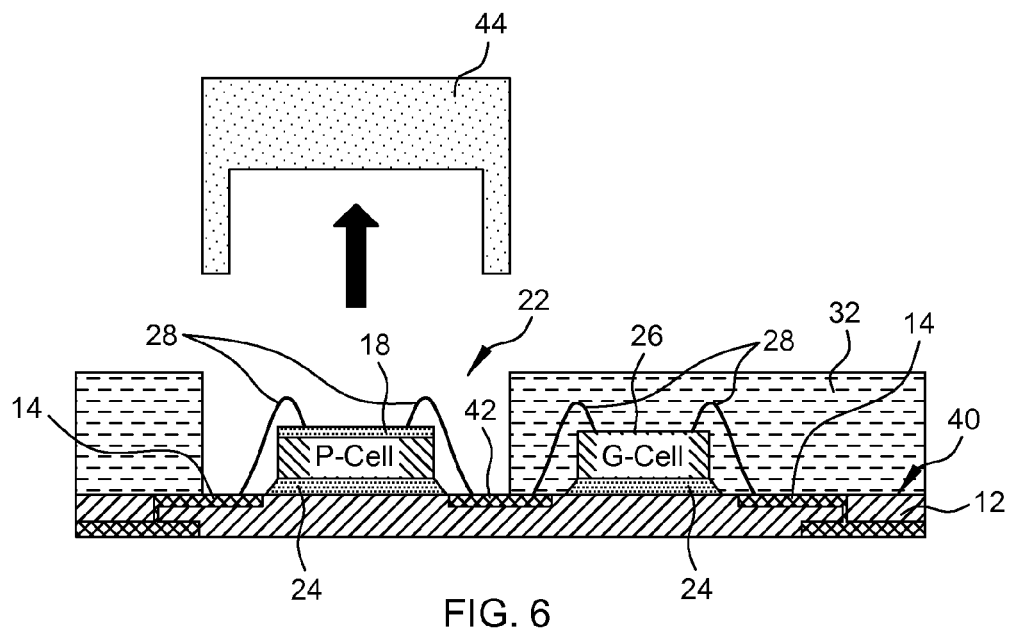
Figure 7:
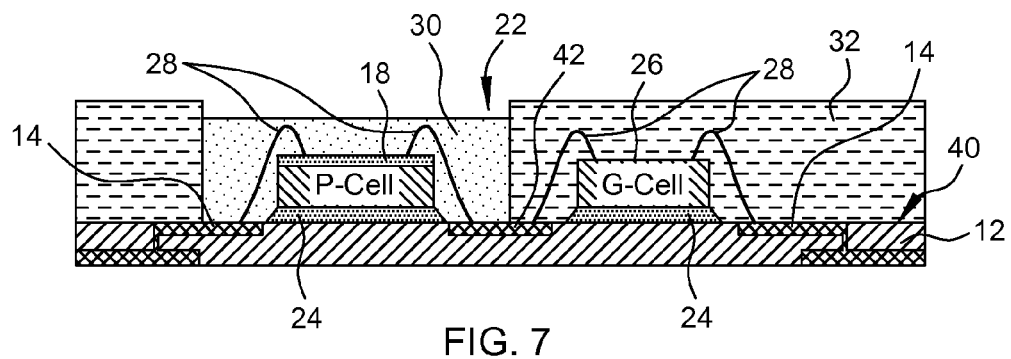

FIG. 6 is an illustration of a step of retracting the cavity pin 44 from the substrate 12. As illustrated, the cavity pin 44 is retracted to form a cavity 22 around the pressure sensor die 18. A gel material 30 is then dispensed within the cavity 22 as illustrated in FIG. 7. The gel material 30, which may be a silicon-based gel, is dispensed into the cavity 22 to cover the pressure sensor die 18 and is subsequently cured. The gel material 30 may be dispensed with a nozzle of a conventional dispensing machine, as is known in the art. In one embodiment, a lid (not shown) may be attached to the substrate 12 to cover the pressure sensor die 18.

Figure 8:
Figure 9:
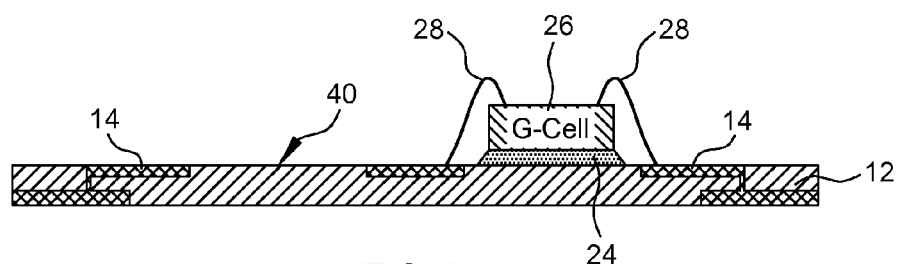

Referring now to FIGS. 8-14, a method of assembling a pressure sensor device in accordance with another embodiment of the invention will be described. FIG. 8 is a side cross-sectional view showing the substrate 12 having the substrate connection pads 14. One or more semiconductor dies 26 are first attached to the first major surface 40 of the substrate 12, as illustrated in FIG. 9. In this example embodiment, a G-cell die is attached to the substrate 12. In another example embodiment, additional dies such as microcontroller (MCU) die are attached to the substrate 12. The one or more semiconductor dies 26 are attached to the substrate by a die attach adhesive 24.

In the illustrated embodiment, the bond pads of the pressure sensor die 18 and the one or more additional semiconductor dies 26 are electrically connected to the respective substrate connection pads 14 of the substrate with wires 28 using a well known wire bonding process.

Figure 10:
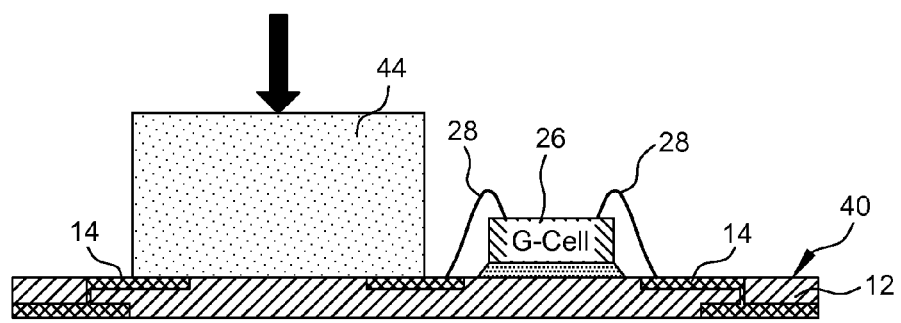
Figure 11:
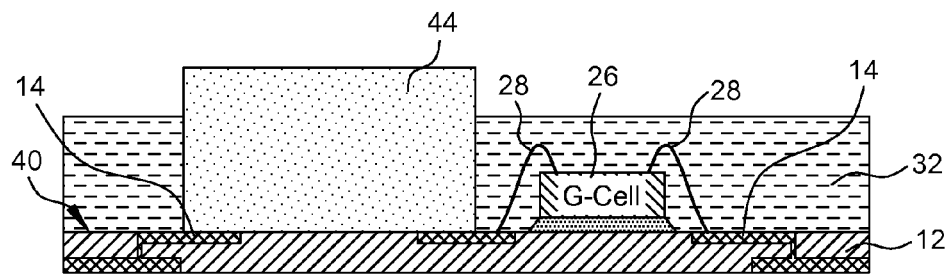

FIG. 10 shows the step of placing a retractable cavity pin 44 on the first major surface 40 of the substrate 12. In the illustrated embodiment, the retractable cavity pin 44 is generally rectangular in shape. However other shapes may be envisaged. A molding compound 32 such as epoxy is then dispensed onto the first major surface 40 of the substrate 12, as illustrated in FIG. 11. The molding compound 32 surrounds the one or more semiconductor dies 26 and the cavity pin 44.

Figure 12:
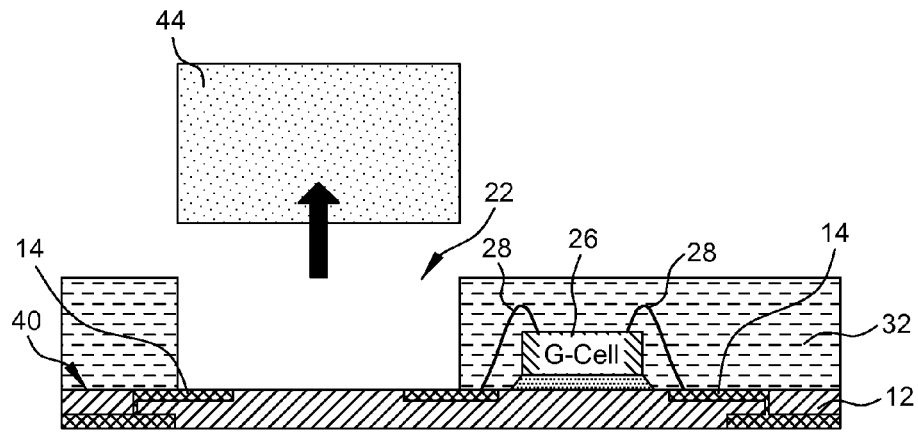
Figure 13:
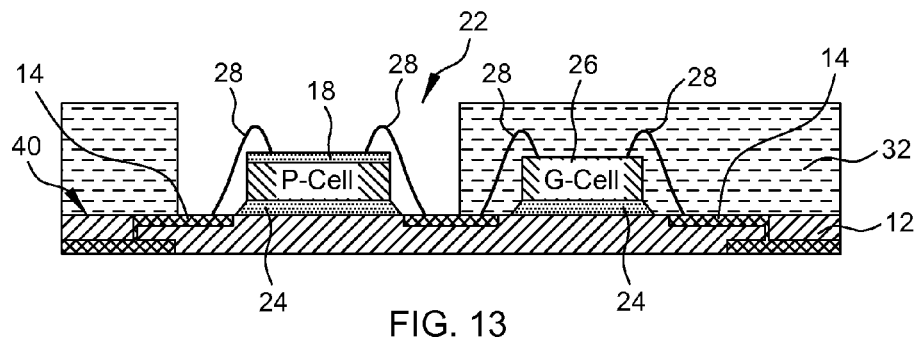

FIG. 12 shows the step of retracting the cavity pin 44 from the substrate 12. As illustrated, the cavity pin 44 is retracted to form the cavity 22 adjacent to the one or more semiconductor dies 26. FIG. 13 shows the step of attaching a pressure sensor die 18 to the substrate 12. The pressure sensor die 18 is attached to the die-attach area 20 within the cavity 22 by a die attach adhesive 24 and bond pads of the pressure sensor die 18 are electrically connected to respective substrate connection pads by bond wires 28.

Figure 14:
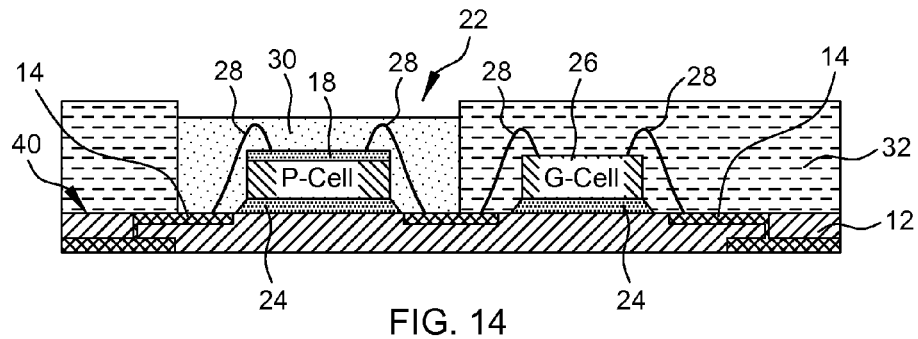

FIG. 14 shows the step of dispensing a gel material 30 within the cavity 22 such that the gel material 30 substantially fills the cavity 22 and covers the pressure sensor die 18. The gel material 30, which may be a silicon-based gel, is dispensed into the cavity 22 and is subsequently cured. The gel material 30 may be dispensed with a nozzle of a conventional dispensing machine, as is known in the art.

The present invention, as described above, allows for forming a robust pressure sensor package by forming a molded cavity after attaching and wire bonding the pressure sensor die to the substrate. The technique uses a retractable cavity pin to form the cavity and does not require a pre-molded lead frame thereby reducing the overall packaging costs. Moreover, the package formed using the technique described above does not have gel bleed issues between the mold and the leads.

By now it should be appreciated that there has been provided an improved packaged pressure sensor device and a method of forming the packaged pressure sensor device. Circuit details are not disclosed because knowledge thereof is not required for a complete understanding of the invention. Although the invention has been described using relative terms such as "front," "back," "top," "bottom," "over," "under" and the like in the description and in the claims, such terms are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. A method of assembling a pressure sensor device, comprising the steps of:
 providing a substrate having a plurality of substrate connection pads;
 attaching a sensor die to a first major surface of the substrate;
 electrically connecting bond pads of the sensor die to the respective substrate connection pads;
 placing a retractable cavity pin on the first major surface of the substrate such that the cavity pin covers the sensor die and the electrical connections thereto;

dispensing a molding compound onto the first major surface of the substrate such that the molding compound surrounds the sensor die and the cavity pin;

retracting the cavity pin, whereby a cavity around the sensor die is formed; and dispensing a gel material within the cavity, wherein the gel material substantially fills the cavity and covers the sensor die.

2. The method of assembling a pressure sensor device of claim 1, wherein the substrate comprises a flexible printed circuit board.

3. The method of assembling a pressure sensor device of claim 1, wherein the sensor die comprises a piezo resistive transducer (PRT) semiconductor die.

4. The method of assembling a pressure sensor device of claim 1, further comprising attaching one or more additional semiconductor dies to the first major surface of the substrate prior to placing the cavity pin, wherein the molding compound encapsulates the one or more additional semiconductor dies.

5. The method of assembling a pressure sensor device of claim 4, further comprising electrically connecting the one or more additional semiconductor dies to respective substrate pads.

6. The method of forming a pressure sensor device of claim 5, further comprising electrically connecting the one or more additional semiconductor dies to the sensor die.

7. The method of assembling a pressure sensor device of claim 4, wherein the one or more additional semiconductor dies comprise G-cell and microcontroller (MCU) dies.

8. The method of assembling a pressure sensor device of claim 7, further comprising attaching a lid to the substrate to cover the sensor die.

9. The method of assembling a pressure sensor device of claim 1, wherein the bond pads of the sensor die are electrically connected to the substrate pads with wires using a wire bonding process.

10. The method of assembling a pressure sensor package of claim 1, further comprising curing the molding compound prior to retracting the cavity pin.

11. A method of assembling a pressure sensor device, comprising the steps of:

providing a substrate having a plurality of substrate connection pads;

attaching one or more semiconductor dies to a first major surface of the substrate;

electrically connecting bond pads of the one or more semiconductor dies to respective substrate connection pads of the substrate;

placing a retractable cavity pin on the first major surface of the substrate;

dispensing a molding compound onto the first major surface of the substrate such that the molding compound surrounds the one or more semiconductor dies and the cavity pin;

retracting the cavity pin, whereby a cavity is formed; and attaching a pressure sensor die to a die-attach area within the cavity and electrically connecting bond pads of the pressure sensor die to the respective substrate connection pads; and dispensing a gel material within the cavity such that the gel material substantially fills the cavity and covers the pressure sensor die.

12. The method of assembling a pressure sensor device of claim 11, wherein the substrate comprises a flexible printed circuit board.

13. The method of assembling a pressure sensor device of claim 11, wherein the pressure sensor die comprises a piezo resistive transducer (PRT) semiconductor die.

14. The method of assembling a pressure sensor device of claim 11, wherein the one or more semiconductor dies comprise G-cell and microcontroller (MCU) dies.

15. A method of assembling a pressure sensor device, comprising the steps of:

providing a substrate having a plurality of electrical connection pads on a first major surface of the substrate;

attaching a pressure sensor die and one or more additional semiconductor dies to the first major surface of the substrate with a die attach adhesive;

electrically connecting bond pads of each of the pressure sensor die and the one or more additional semiconductor dies to the substrate connection pads with bond wires;

placing a retractable cavity pin over the pressure sensor die and the electrical connections thereto;

dispensing a molding compound onto the first major surface of the substrate, wherein the molding compound covers the one or more additional semiconductor dies and the electrical connections thereto;

retracting the cavity pin, whereby a cavity is formed around the pressure sensor die; and dispensing a gel material within the cavity such that the gel material substantially fills the cavity and covers the pressure sensor die.

16. The method of assembling a pressure sensor device of claim 15, further comprising attaching a lid to the substrate with a lid attach adhesive, wherein the lid covers the pressure sensor die and the gel material.

17. The method of assembling a pressure sensor device of claim 16, further comprising electrically connecting the pressure sensor die to the one or more additional semiconductor dies with additional bond wires before placing the retractable cavity pin over the pressure sensor die.

* * * * *